United States Patent [19]
Miks et al.

[11] Patent Number: 6,103,548
[45] Date of Patent: Aug. 15, 2000

[54] SEMICONDUCTOR DEVICE AND METHOD OF MANUFACTURE

[75] Inventors: Jeffrey A. Miks, Chandler; Dilip Patel; Dwight L. Daniels, both of Mesa; Stephen C. St. Germain, Scottsdale, all of Ariz.

[73] Assignee: Motorola, Inc., Schaumburg, Ill.

[21] Appl. No.: 08/931,982

[22] Filed: Sep. 17, 1997

[51] Int. Cl.[7] ................................................. H01L 21/20
[52] U.S. Cl. .......................... 438/106; 438/107; 438/108; 438/113
[58] Field of Search ..................................... 438/618, 106, 438/107, 108, 113, 125; 29/847; 257/778

[56] References Cited

U.S. PATENT DOCUMENTS 5,397,917   3/1995   Ommen et al. ........................ 257/698
5,691,568   11/1997  Chou et al. ............................ 257/700

*Primary Examiner*—Roy Potter
*Attorney, Agent, or Firm*—Lanny L. Parker; A. Kate Huffman

[57] ABSTRACT

A semiconductor device includes a substrate (10) that can be cut into different sizes. A plurality of wirebond fingers (12) are formed on a top surface (13) of the substrate (10). The plurality of wirebond fingers (12) are located within concentric interconnect regions (23, 25, 27, 29, 31, 33, 35) and electrically connected to a via (14) by a signal interconnect line (11). The size of substrate (10) can be altered by cutting the substrate (10) to remove any of the interconnect regions (23, 25, 27, 29, 31, 33, 35). A semiconductor component (44) attached to the top side (13) of the substrate (10) can have a die pad (48) wirebonded to any of the plurality of wirebond fingers (12) located along the signal interconnect line (11) for connection to the via (14).

9 Claims, 4 Drawing Sheets

SEMICONDUCTOR DEVICE AND METHOD OF MANUFACTURE

BACKGROUND OF THE INVENTION

The present invention relates, in general, to semiconductor components and, more particularly, to packages for semiconductor components.

Packages protect semiconductor components from physical and environmental stresses as well as provide a means for sending and receiving electrical signals to and from the semiconductor component. An important type of package is a Ball Grid Array (BGA) package. BGA packages are surface mount packages that don't have leads commonly found in packages such as dual in-line packages, plastic leaded chip carriers, quad flat packs, or the like. Thus, BGA packages do not present skew and lead co-planarity problems that are typical of leaded devices. In addition, BGA packages typically offer higher Input/Output (I/O) interconnect quantities per given area and thus occupy less circuit board space and offer lower lead inductance than conventional packages.

The Ball Grid Array (BGA) package is a surface mount package that is designed to accommodate single semiconductor device sizes. Additionally, a variety of different sized surface mount packages allow selection of the surface mount package based on the number of electrical connections to the semiconductor device. However, the variety of different sized surface mount packages does not always provide a cost effective solution to the need for packaging different sized semiconductor components. For instance, the large variety of different sized packages increases the semiconductor device manufacturer's inventory, as well as the costs for assembling, testing, and shipping the semiconductor devices.

Accordingly, it would be advantageous to have a BGA package that reduces the semiconductor device manufacturer's costs. It would be of further advantage to provide a common package capable of accommodating a wider range of sizes of semiconductor components than is presently available.

DETAILED DESCRIPTION OF THE DRAWINGS

Generally, the present invention provides a structure and a method for packaging semiconductor components. More particularly, the present invention provides a structure that can be used for packaging semiconductor components of various sizes and/or differing Input/Output (I/O) pin counts and/or configurations. In accordance with one aspect of the present invention, the structure includes a substrate having conductive traces formed thereon, wherein portions of the substrate can be excised or removed to form a package of a predetermined size. The universal substrate is suitable for use in Ball Grid Arrays (BGAs), Glob Top Arrays (GTAs), Pin Grid Arrays (PGAs), Tape Automated Bonding (TAB) packages, flip-chip packages, and the like. Because the substrate/interconnect structure can be used with many different sizes of semiconductor components, it is referred to as a universal substrate or as Variable Incremental Substrate Nesting (VISN). The universal substrate reduces package tooling costs and package development cycle times.

Figure 1:
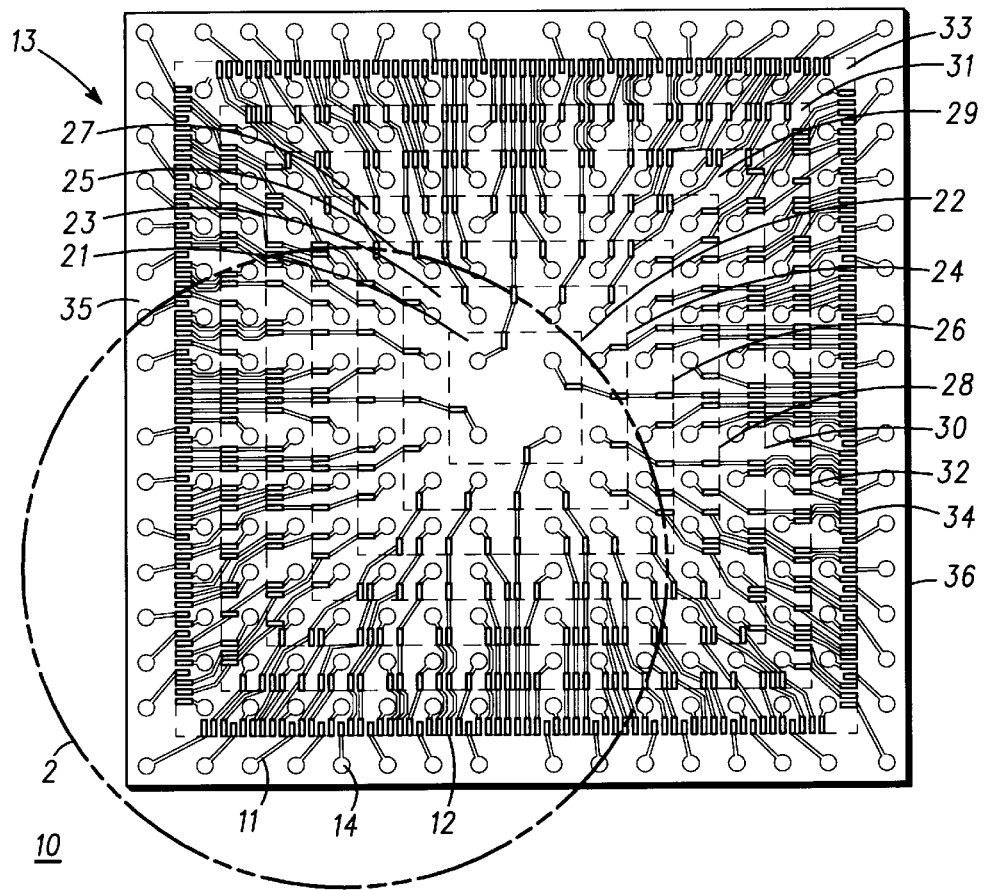
FIG. 1 is a top view of a substrate having interconnect lines, wirebond fingers, and vias formed in accordance with the present invention.

FIG. 1 is a top view of a substrate 10 having a major or top surface 13. It should be noted that substrate 10 has a major or bottom surface 16 which is described with reference to FIG. 3. By way of example, substrate 10 is a glass fabric-reinforced resin, such as an epoxy, polyimide, or phenolic resin. Preferably, substrate 10 is comprised of a bismaleimidetriazine (BT) resin. Other suitable substrate materials include epoxy-glass composites, buildup or high density interconnect printed circuit board materials, flexible circuits, ceramics, or the like. Also, reinforcement materials other than glass can be used in the substrate. Examples of other suitable reinforcement materials include aramid, ceramic fibers, and particle reinforcement materials.

Signal interconnect lines 11 and wirebond fingers 12 are formed on top surface 13. In addition, electrically conductive vias 14 are formed in substrate 10, wherein vias 14 extend from top surface 13 to a bottom surface 16 (shown in FIG. 3) of substrate 10. Electrically conductive vias 14 electrically couple signal interconnect lines 11 and wirebond fingers 12 to corresponding bond pads 17 (shown in FIG. 3) on bottom surface 16. Vias 14 are formed in substrate 10 by drilling or punching holes (vias) through substrate 10. Vias 14 are shown having circular shapes but other shapes such as, for example, square shapes can be formed in substrate 10. The sides of vias 14 are either coated or filled with an electrically conductive material such as, for example, copper.

Signal interconnect lines 11 and wirebond fingers 12 are typically formed by laminating a conductive foil to top surface 13 and to bottom surface 16 of substrate 10. The foil or film is typically patterned using lithographic techniques. Alternatively, signal interconnect lines 11 and wirebond fingers 12 may be screen printed, plated, or otherwise deposited onto top surface 13 and bottom surface 16 of substrate 10. Preferably, copper is used for signal interconnect lines 11 and wirebond fingers 12. Wirebond fingers 12 are typically plated with nickel to form a barrier layer, followed by a layer of gold to establish a non-oxidizable surface suitable for wirebonding. It should be noted that the type of metals used for signal interconnect lines 11 and wirebond fingers 12 are not a limitation of the present invention.

Signal interconnect lines 11 are also referred to as routing traces or interconnect traces and provide electrical conduction paths for signals from vias 14 to wirebond fingers 12. Wirebond fingers 12 are also referred to as interconnect pads and provide a means for electrically coupling a die pad on a semiconductor component (not shown) to a corresponding bond pad on bottom surface 16.

Preferably, wirebond fingers 12 and vias 14 are formed as concentric patterns or nested ring-like structures on substrate 10. To further illustrate the nested ring-like patterns, substrate 10 is divided into a plurality of interconnect regions. The interconnect regions are shown in FIG. 1 as being bounded by square shaped imaginary cut-lines 22, 24, 26, 28, 30, 32 and 34. It should be understood that imaginary cut-lines 22, 24, 26, 28, 30, 32 and 34 are shown as broken lines and indicate where portions of substrate 10 are to be cut. In other words, imaginary cut-lines 22, 24, 26, 28, 30, 32 and 34 are not actually present on substrate 10, but are shown to simplify the explanation of the present invention. Interconnect lines 11 and wirebond fingers 12 are formed on top surface 13 in each of the interconnect regions. Similarly, corresponding bond pads 17 are formed on bottom surface 16 in each of the interconnect regions. Bond pads 17 are described with reference to FIG. 2. Interconnect lines 11 are coupled to corresponding bond pads 17 by vias 14.

Figure 2:
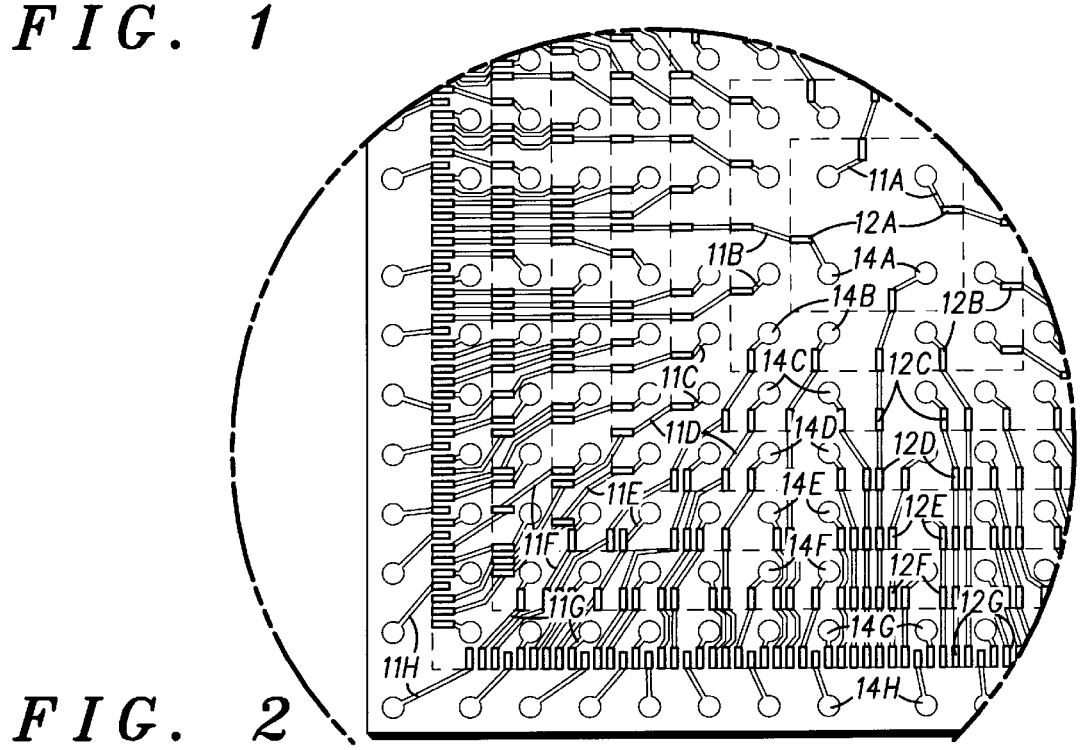
FIG. 2 is an enlarged view of a region of the substrate shown in FIG. 1.

An interconnect region 21 is bounded by a square shaped imaginary cut line 22. Interconnect region 21 includes four wirebond fingers 12 and four vias 14 on top surface 13. Each wirebond finger 12 is coupled to a corresponding via 14 by an interconnect line 11. Referring now to FIG. 2, an enlarged view of the region identified by reference number 2 is shown. In FIG. 2, the letter "A" has been appended to reference number 11 to show that interconnect lines 11A are within interconnect region 21 and are a subset of the plurality of signal interconnect lines 11. Similarly, the letter "A" has been appended to reference number 12 to show that wirebond fingers 12A are within interconnect region 21 and are a subset of the plurality of wirebond fingers 12. Further, the letter "A" has been appended to reference number 14 to show that vias 14A are within interconnect region 21 and are a subset of the plurality of vias 14.

Referring to FIGS. 1 and 2, interconnect region 21 is surrounded by an interconnect region 23. Interconnect region 23 is bounded by square shaped imaginary cut lines 22 and 24 and includes sixteen interconnect lines 11, sixteen wirebond fingers 12, and twelve vias 14. Twelve of the wirebond fingers 12B are coupled to corresponding vias 14B by interconnect lines 11B. In addition, four of the wirebond fingers 12B are coupled to corresponding wirebond fingers 12A by interconnect lines 11B. In FIG. 2, the letter "B" has been appended to reference number 11 to show that interconnect lines 11B are within interconnect region 23 and are a subset of the plurality of signal interconnect lines 11. Similarly, the letter "B" has been appended to reference number 12 to show that wirebond fingers 12B are within interconnect region 23 and are a subset of the plurality of wirebond fingers 12. Further, the letter "B" has been appended to reference number 14 to show that vias 14B are within interconnect region 23 and are a subset of the plurality of vias 14.

Interconnect region 23 is surrounded by an interconnect region 25. Interconnect region 25 is bounded by square shaped imaginary cut lines 24 and 26 and includes thirty-six interconnect lines 11, thirty-six wirebond fingers 12, and twenty vias 14. Twenty wirebond fingers 12C are coupled to corresponding vias 14C by interconnect lines 11C. Twelve wirebond fingers 12C are coupled to corresponding wirebond fingers 12B and vias 14B by interconnect lines 11C and 11B, respectively. In addition, four wirebond fingers 12C are coupled to corresponding wirebond fingers 12B, 12A and vias 14A by interconnect lines 11, 11B, and 11A respectively. In FIG. 2, the letter "C" has been appended to reference number 11 to show that interconnect lines 11C are within interconnect region 25 and are a subset of the plurality of signal interconnect lines 11. Similarly, the letter "C" has been appended to reference number 12 to show that wirebond fingers 12C are within interconnect region 25 and are a subset of the plurality of wirebond fingers 12. Further, the letter "C" has been appended to reference number 14 to show that vias 14C are within interconnect region 25 and are a subset of the plurality of vias 14.

Interconnect region 25 is surrounded by an interconnect region 27. Interconnect region 27 is bounded by square shaped imaginary cut lines 26 and 28 and includes sixty-four interconnect lines 11, sixty-four wirebond fingers 12, and twenty-eight vias 14. Twenty-eight wirebond fingers 12D are coupled to corresponding vias 14D by interconnect lines 11D. Twenty wirebond fingers 12D are coupled to corresponding wirebond fingers 12C and vias 14C by interconnect lines 11D and 11C, respectively. In addition, twelve wirebond fingers 12D are coupled to corresponding wirebond fingers 12C and 12B and vias 14B by interconnect lines 11D, 11C, and 11B respectively. Four wirebond fingers 12D are coupled to corresponding wirebond fingers 12C, 12B, and 12A, and to vias 14A by interconnect lines 11D, 11C, 11B, and 11A, respectively. In FIG. 2, the letter "D" has been appended to reference number 11 to show that interconnect lines D are within interconnect region 27 and are a subset of the plurality of signal interconnect lines 11. Similarly, the letter "D" has been appended to reference number 12 to show that wirebond fingers 12D are within interconnect region 27 and are a subset of the plurality of wirebond fingers 12. Further, the letter "D" has been appended to reference number 14 to show that vias 14D are within interconnect region 27 and are a subset of the plurality of vias 14.

Interconnect region 27 is surrounded by an interconnect region 29. Interconnect region 29 is bounded by square shaped imaginary cut lines 28 and 30.

Interconnect region 29 includes one-hundred interconnect lines 11, one-hundred wirebond fingers 12, and thirty-six vias 14. Thirty-six wirebond fingers 12E are coupled to corresponding vias 14E by interconnect lines 11E. Twenty-eight wirebond fingers 12E are coupled to wirebond fingers 12D by interconnect lines 11E. Twenty wirebond fingers 12E are coupled to corresponding wirebond fingers 12D and 12C and vias 14C by interconnect lines 11E, 11D, and 11C, respectively. In addition, twelve wirebond fingers 12E are coupled to corresponding wirebond fingers 12D, 12C, 12B, and vias 14B by interconnect lines 11E, 11D, 11C, and 11B, respectively. Four wirebond fingers 12E are coupled to corresponding wirebond fingers 12D, 12C, 12B, and 12A, and to vias 14A by interconnect lines 11E, D, 11C, 11B, and 11A, respectively. In FIG. 2, the letter "E" has been appended to reference number 11 to show that interconnect lines 11E are within interconnect region 29 and are a subset of the plurality of signal interconnect lines 11. Similarly, the letter "E" has been appended to reference number 12 to show that wirebond fingers 12E are within interconnect region 29 and are a subset of the plurality of wirebond fingers 12. Further, the letter "E" has been appended to reference number 14 to show that vias 14E are within interconnect region 29 and are a subset of the plurality of vias 14.

Interconnect region 29 is surrounded by an interconnect region 31. Interconnect region 31 is bounded by square shaped imaginary cut lines 30 and 32 and includes one-hundred and forty-four interconnect lines 11, one-hundred and forty-four wirebond fingers 12, and forty-four vias 14. Forty-four wirebond fingers 12F are coupled to corresponding vias 14F by interconnect lines 11F. Thirty-six wirebond fingers 12F are coupled to corresponding wirebond fingers 12E and vias 14E by interconnect lines 11F and 11E, respectively. Twenty-eight wirebond fingers 12F are coupled to wirebond fingers 12E and 12D by interconnect lines 11F, 1E, and 11D, respectively. Twenty wirebond fingers 12F are coupled to corresponding wirebond fingers 12E, 12D, and 12C and vias 14C by interconnect lines 11F, 11E, 11D, and 11C, respectively. In addition, twelve wirebond fingers 12F are coupled to corresponding wirebond fingers 12E, 12D, 12C, 12B and vias 14B by interconnect lines 11F, 11E, 11D, 11C, and 11B respectively. Four wirebond fingers 12F are coupled to corresponding wirebond fingers 12E, 12D, 12C, 12B, and 12A, and to vias 14A by interconnect lines 11F, 11E, 11D, 11C, 11B, and 11A, respectively. In FIG. 2, the letter "F" has been appended to reference number 11 to show that interconnect lines 11F are within interconnect region 31 and are a subset of the plurality of signal interconnect lines 11. Similarly, the letter "F" has been appended to reference number 12 to show that wirebond fingers 12F are within interconnect region 31 and are a subset of the plurality of wirebond fingers 12. Further, the letter "F" has been appended to reference number 14 to show that vias 14F are within interconnect region 31 and are a subset of the plurality of vias 14.

Interconnect region 31 is surrounded by an interconnect region 33. Interconnect region 33 is bounded by square shaped imaginary cut lines 32 and 34 and includes one-hundred and ninety-six interconnect lines 11, two-hundred and fifty-six wirebond fingers 12, and fifty-two vias 14. Fifty-two wirebond fingers 12G are coupled to corresponding vias 14G by interconnect lines 11G. Forty-two wirebond fingers 12G are coupled to corresponding wirebond fingers 12F and vias 14F by interconnect lines 11G and 11F, respectively. Thirty-six wirebond fingers 12G are coupled to corresponding wirebond fingers 12F and 12E and vias 14E by interconnect lines 11G, 11F, and 11E, respectively. Twenty-eight wirebond fingers 12G are coupled to wirebond fingers 12F, 12E, and 12D by interconnect lines 11G, 11F, 11E, and 11D, respectively. Twenty wirebond fingers 12G are coupled to corresponding wirebond fingers 12F, 12E, 12D and 12C and vias 14C by interconnect lines 11G, 11F, 11E, 11D, and 11C, respectively. In addition, twelve wirebond fingers 12G are coupled to corresponding wirebond fingers 12F, 12E, 12D, 12C, 12B and vias 14B by interconnect lines 11G, 11F, 11E, 11D, 11C, and 11B, respectively. Four wirebond fingers 12G are coupled to corresponding wirebond fingers 12F, 12E, 12D, 12C, 12B, and 12A, and to vias 14A by interconnect lines 11G, 11F, 11E, 11D, 11C, 11B, and 11A, respectively. In FIG. 2, the letter "G" has been appended to reference number 11 to show that interconnect lines 11G are within interconnect region 33 and are a subset of the plurality of signal interconnect lines 11. Similarly, the letter "G" has been appended to reference number 12 to show that wirebond fingers 12G are within interconnect region 33 and are a subset of the plurality of wirebond fingers 12. Further, the letter "G" has been appended to reference number 14 to show that vias 14G are within interconnect region 33 and are a subset of the plurality of vias 14.

Interconnect region 33 is surrounded by an interconnect region 35. Interconnect region 35 is bounded by square shaped imaginary cut line 34 and outside boundary or edge 36 and includes sixty interconnect lines 11 and sixty vias 14. The vias 14H are connected to wirebond fingers 12G by interconnect lines 11H. In FIG. 2, the letter "H" has been appended to reference number 11 to show that interconnect lines 11H are within interconnect region 35 and are a subset of the plurality of signal interconnect lines 11. Similarly, the letter "H" has been appended to reference number 14 to show that vias 14H are within interconnect region 35 and are a subset of the plurality of vias 14.

Figure 3:
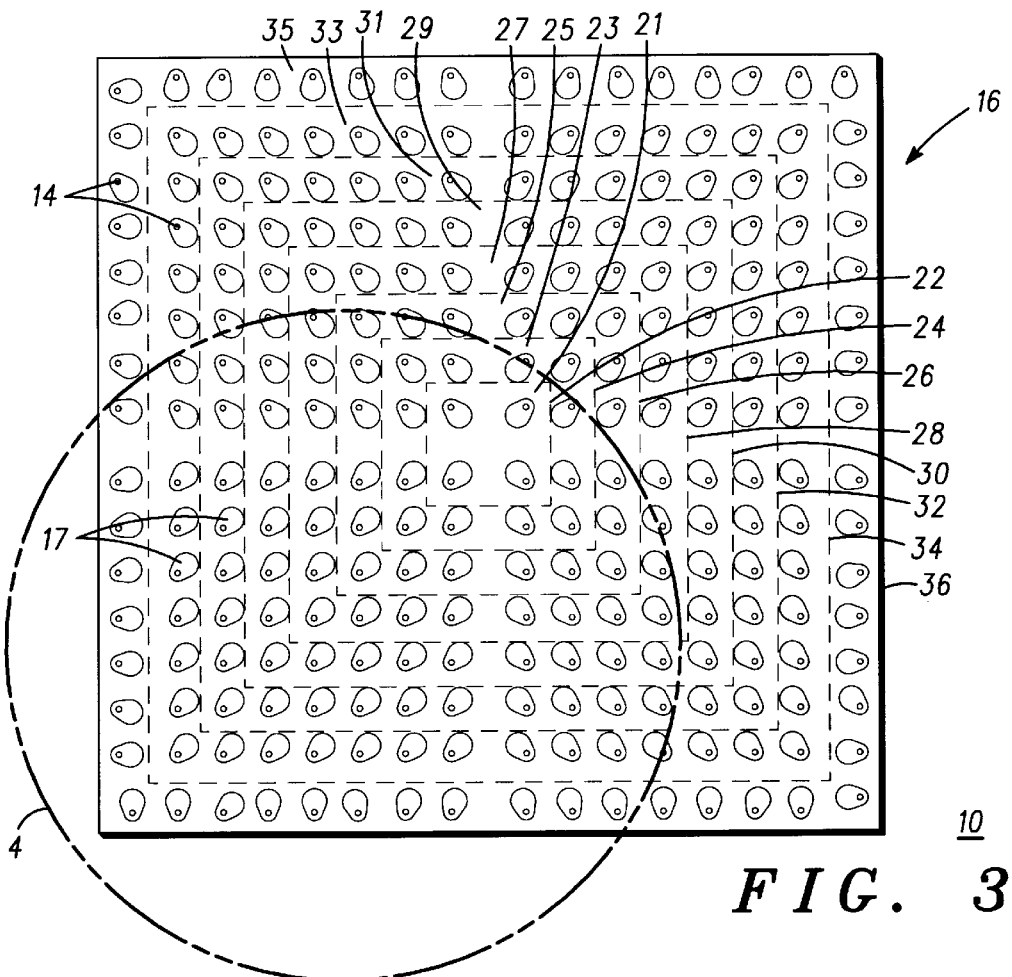
FIG. 3 is a bottom view of the substrate and illustrates a bottom surface having a plurality of bond pads and vias that provide connections to the interconnect lines on the top surface of the substrate of FIG. 1.

FIG. 3 is a bottom view of substrate 10 and illustrates bottom surface 16 having a plurality of bond pads 17 formed thereon. By way of example, each bond pad 17 has a tear-drop shape that includes a larger portion and a smaller portion. A via 14 is formed in each smaller portion of bond pad 17. Alternatively, via 14 could be formed outside bond pad 17 and electrically connected to bond pad 17. Vias 14 electrically couple signal interconnect lines 11 on top surface 13 to corresponding bond pads 17 on bottom surface 16. Each larger portion of bond pad 17 is sized for receiving a conductive material such as, for example, a solder ball, conductive paste, or a conductive epoxy material. It should be noted that the same reference numbers are used in the figures to denote the same elements. It should be further noted that bond pads 17 are not limited to having tear-drop shapes. For example, bond pads 17 can have a circular shape. Via 14 can be centrally located within bond pad 17 when it has a circular shape.

Similar to the formation of interconnect lines 11 and wirebond fingers 12, bond pads 17 are typically formed by laminating a conductive foil to bottom surface 16 and using lithographic techniques to pattern bond pads 17. Bond pads 17 may be screen printed, plated, or otherwise deposited onto bottom surface 16. Preferably, copper is used for bond pads 17 and a nickel plating covers the copper to form a barrier layer, followed by a layer of gold to establish a non-oxidizable surface suitable for soldering. It should be noted that the type of metals used for bond pads 17 are not a limitation of the present invention.

Figure 4:
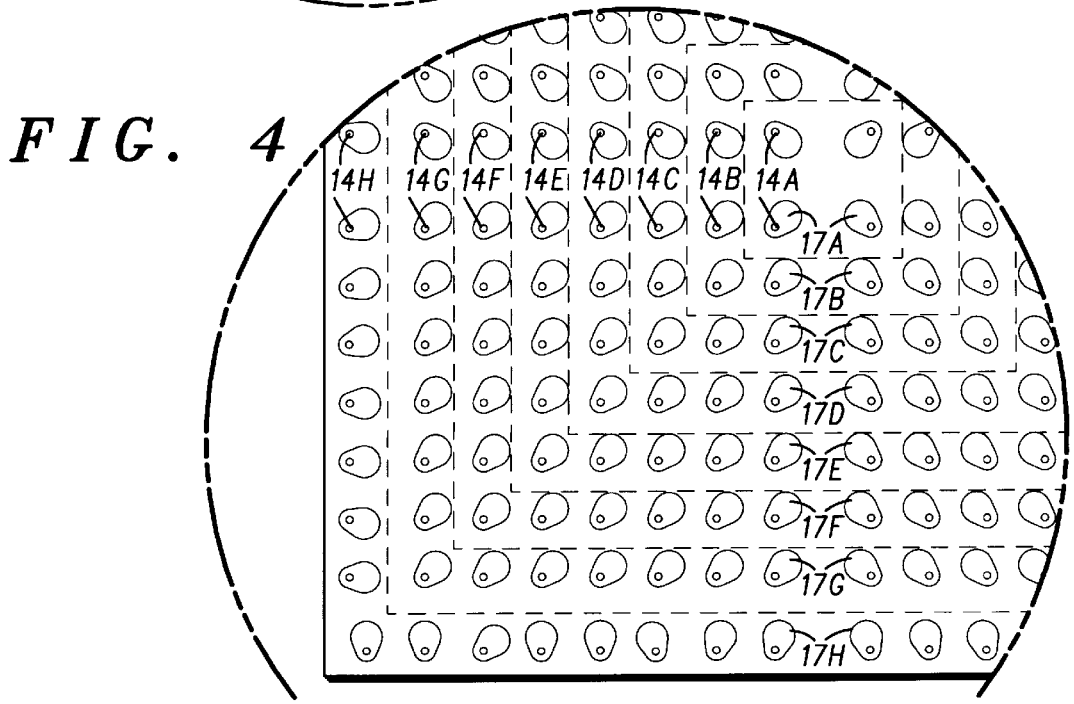
FIG. 4 is an enlarged view of a region of the substrate shown in FIG. 3.

Like wirebond fingers 12, bond pads 17 are preferably formed in concentric patterns or nested ring-like structures. Because imaginary cut lines 22, 24, 26, 28, 30, 32, and 34 extend through substrate 10, bottom surface 16 is divided into interconnect regions 21, 23, 25, 27, 29, 31, 33, and 35 described with reference to FIG. 1. Referring now to FIG. 4, an enlarged view of the region identified by reference number 4 is shown. Four bond pads 17A are formed on the portion of bottom surface 16 in interconnect region 21. Bond pads 17A are electrically coupled to corresponding signal interconnect lines 11A by vias 14A. It should be noted that the letter "A" has been appended to reference number 17 to show that bond pads 17A are within interconnect region 21 and are a subset of the plurality of bond pads 17.

Referring to FIGS. 3 and 4, interconnect region 21 on bottom surface 16 of substrate 10 is surrounded by interconnect region 23. Twelve bond pads 17B are formed on the portion of bottom surface 16 in interconnect region 23. Bond pads 17B are electrically coupled to corresponding signal interconnect lines 11B by vias 14B. It should be noted that the letter "B" has been appended to reference number 17 to show that bond pads 17B are within interconnect region 23 and are a subset of the plurality of bond pads 17.

Interconnect region 23 on bottom surface 16 of substrate 10 is surrounded by interconnect region 25. Twenty bond pads 17C are formed on the portion of bottom surface 16 in interconnect region 25. Bond pads 17C are electrically coupled to corresponding signal interconnect lines 11C by vias 14C. It should be noted that the letter "C" has been appended to reference number 17 to show that bond pads 17C are within interconnect region 25 and are a subset of the plurality of bond pads 17.

Interconnect region 25 on bottom surface 16 of substrate 10 is surrounded by interconnect region 27. Twenty-eight bond pads 17D are formed on the portion of bottom surface 16 in interconnect region 27. Bond pads 17D are electrically coupled to corresponding signal interconnect lines 11D by vias 14D. It should be noted that the letter "D" has been appended to reference number 17 to show that bond pads 17D are within interconnect region 27 and are a subset of the plurality of bond pads 17.

Interconnect region 27 on bottom surface 16 of substrate 10 is surrounded by interconnect region 29. Thirty-six bond pads 17E are formed on the portion of bottom surface 16 in interconnect region 29. Bond pads 17E are electrically coupled to corresponding signal interconnect lines 11E by vias 14E. It should be noted that the letter "E" has been appended to reference number 17 to show that bond pads 17E are within interconnect region 29 and are a subset of the plurality of bond pads Interconnect region 29 on bottom surface 16 of substrate 10 is surrounded by interconnect region 31. Forty-four bond pads 17F are formed on the portion of bottom surface 16 in interconnect region 31. Bond pads 17F are electrically coupled to corresponding signal interconnect lines 11F by vias 14F. It should be noted that the letter "F" has been appended to reference number 17 to show that bond pads 17F are within interconnect region 31 and are a subset of the plurality of bond pads 17.

Interconnect region 31 on bottom surface 16 of substrate 10 is surrounded by interconnect region 33. Fifty-two bond pads 17G are formed on the portion of bottom surface 16 in interconnect region 33. Bond pads 17G are electrically coupled to corresponding signal interconnect lines 11G by vias 14G. It should be noted that the letter "G" has been appended to reference number 17 to show that bond pads 17G are within interconnect region 33 and are a subset of the plurality of bond pads 17.

Interconnect region 33 on bottom surface 16 of substrate 10 is surrounded by interconnect region 35. Sixty bond pads 17H are formed on the portion of bottom surface 16 in interconnect region 35. Bond pads 17H are electrically coupled to corresponding signal interconnect lines 11H by vias 14H. It should be noted that the letter "H" has been appended to reference number 17 to show that bond pads 17H are within interconnect region 35 and are a subset of the plurality of bond pads 17.

Substrate 10 can be reduced in size by removing any of the interconnect regions such as, for example, interconnect regions 23, 25, 27, 29, 31, 33, and 35, using a punch, a diamond tip saw, a router, a chemical etching process, a laser, or the like. By way of example, nested interconnect region 21 has a width of about three millimeters (mm) and nested interconnect regions 23, 25, 27, 29, 31, 33, and 35 have a width of about one millimeter. In this example, substrate 10 has eight interconnect regions and therefore it has an outer dimension of about 17 mm by 17 mm. It should be noted that neither the number of interconnect regions, the number of wire bond fingers 12, the size of substrate 10, or the pitch of bond pads 17 is limited by the present invention. Removing interconnect region 35 from substrate 10 reduces the size of substrate 10 to about 15 mm by 15 mm. It should be noted that by removing interconnect region 35, sixty vias 14 and bond pads 17 are removed from substrate 10, i.e., vias 14H and bond pads 17H. Removing interconnect region 33 further reduces the size of substrate 10 to about 13 mm by 13 mm. It should be noted that in removing interconnect region 33, an additional fifty-two vias 14 and bond pads 17 are removed from substrate 10, i.e., vias 14G and bond pads 17G. Following a trimming process whereby an interconnect region is removed, each remaining via 14 on substrate 10 is electrically connected to a corresponding wirebond finger 12 (see FIG. 1) located at a peripheral edge of the remaining interconnect regions. By way of example, bond pads 17A, 17B, 17C, 17D, 17E, and 17F each have electrical connections to wirebond fingers 12 located at the peripheral edge of interconnect region 31.

Although interconnect lines 11, wirebond fingers 12, and bond pads 17 have been described as comprising two conductive layers, it should be understood that the number of layers is not a limitation of the present invention. Further, it should be noted that the shape of the nested ring-like structures is not a limitation of the present invention. In other words, the nested ring-like structures can include a variety of geometric shapes such as, for example, rectangular, pentagonal, hexagonal, octagonal, round, an L shape, or the like, rather than the square shape shown in FIGS. 1–4. Also, each nested ring-like structure can have a size that may or may not match the size of an adjacent ring-like structure. It should be further noted that it is not a requirement of the present invention that vias 14 be arrayed in matching rows and columns.

Figure 5:
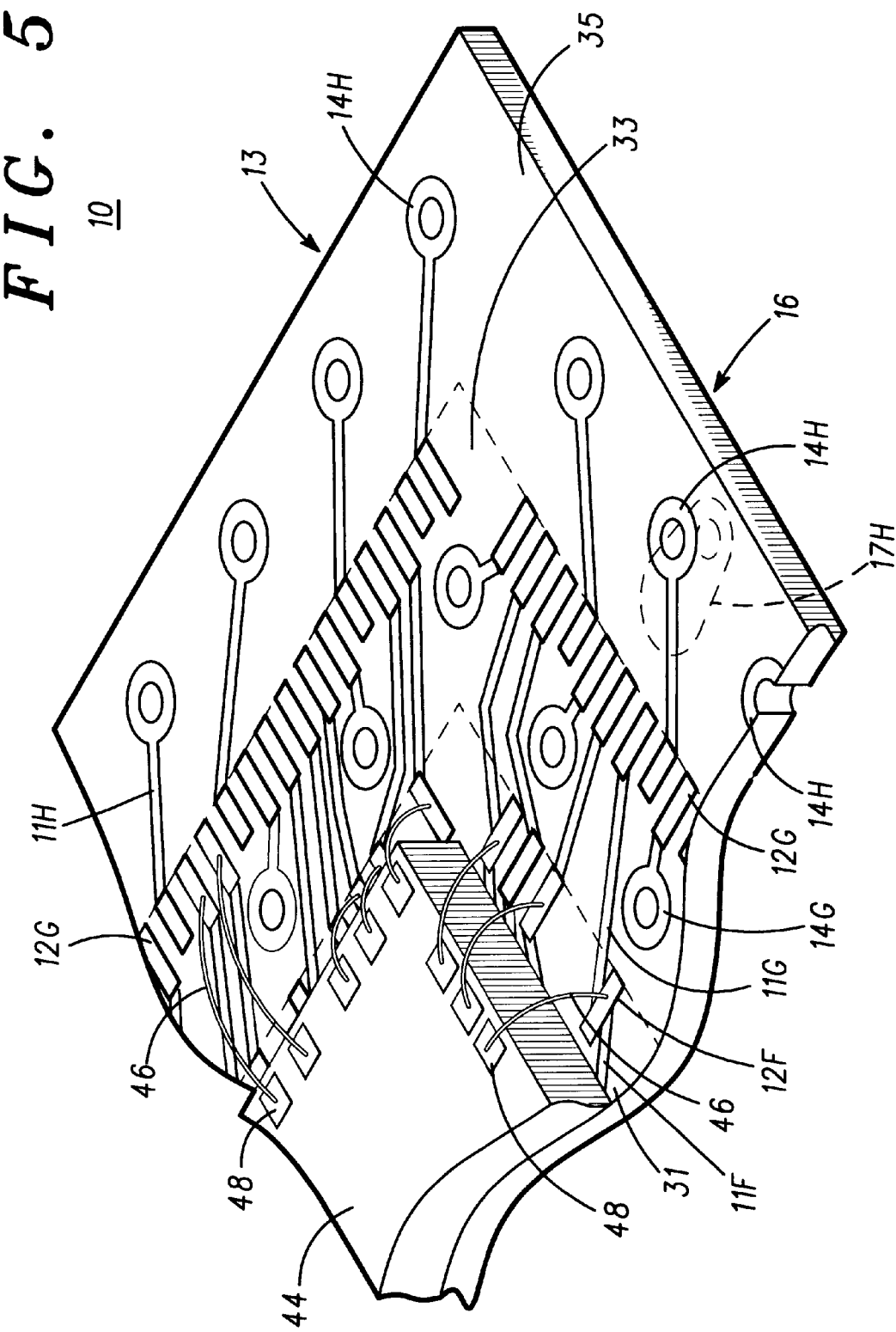
FIG. 5 is a partially cut-away isometric view of a semiconductor component on a substrate in accordance with the present invention.

FIG. 5 is a partially cut-away isometric view of a portion of substrate 10 having a semiconductor component 44 disposed thereon. By way of example, the portion includes interconnect regions 31, 33, and 35. FIG. 5 illustrates the relationship between interconnect lines 11 and wirebond fingers 12 on top surface 13, bond pads 17 on bottom surface 16, and the respective vias 14 therebetween. In particular, FIG. 5 shows interconnect lines 11H and vias 14H in interconnect region 35; interconnect lines 11G, wirebond fingers 12G, and vias 14G in interconnect region 33; and interconnect lines 11F and wirebond fingers 12F in interconnect region 31. In addition, FIG. 5 includes a cross-section of via 14H and another via 14H that illustrates the relationship between an interconnect line 11H and a corresponding bond pad 17H.

A bottom-surface of semiconductor component 44 is attached to top surface 13 using, for example, an electrically nonconductive die attach (not shown). Preferably, wirebonds 46 provide electrical connections from die pads 48 located on the top-surface of semiconductor component 44 to wirebond fingers 12 located at the peripheral edge of interconnect region 27. Typically, die pads 48 are Input/Output (I/O) pads used to transfer signals and operating supply voltages to and from semiconductor component 44.

Alternatively, semiconductor component 44 could be attached to top surface 13 of substrate 10 using a technique known as a flip-chip process. In the flip-chip process, die pads 48 are patterned to correspond to wirebond fingers 12 on top surface 13. Alternatively, wirebond fingers 12 can be patterned to correspond to die pads 48. A conductive material such as, for example, solder balls or conductive paste provides electrical connectivity between die pads 48 and wirebond fingers 12.

Figure 6:
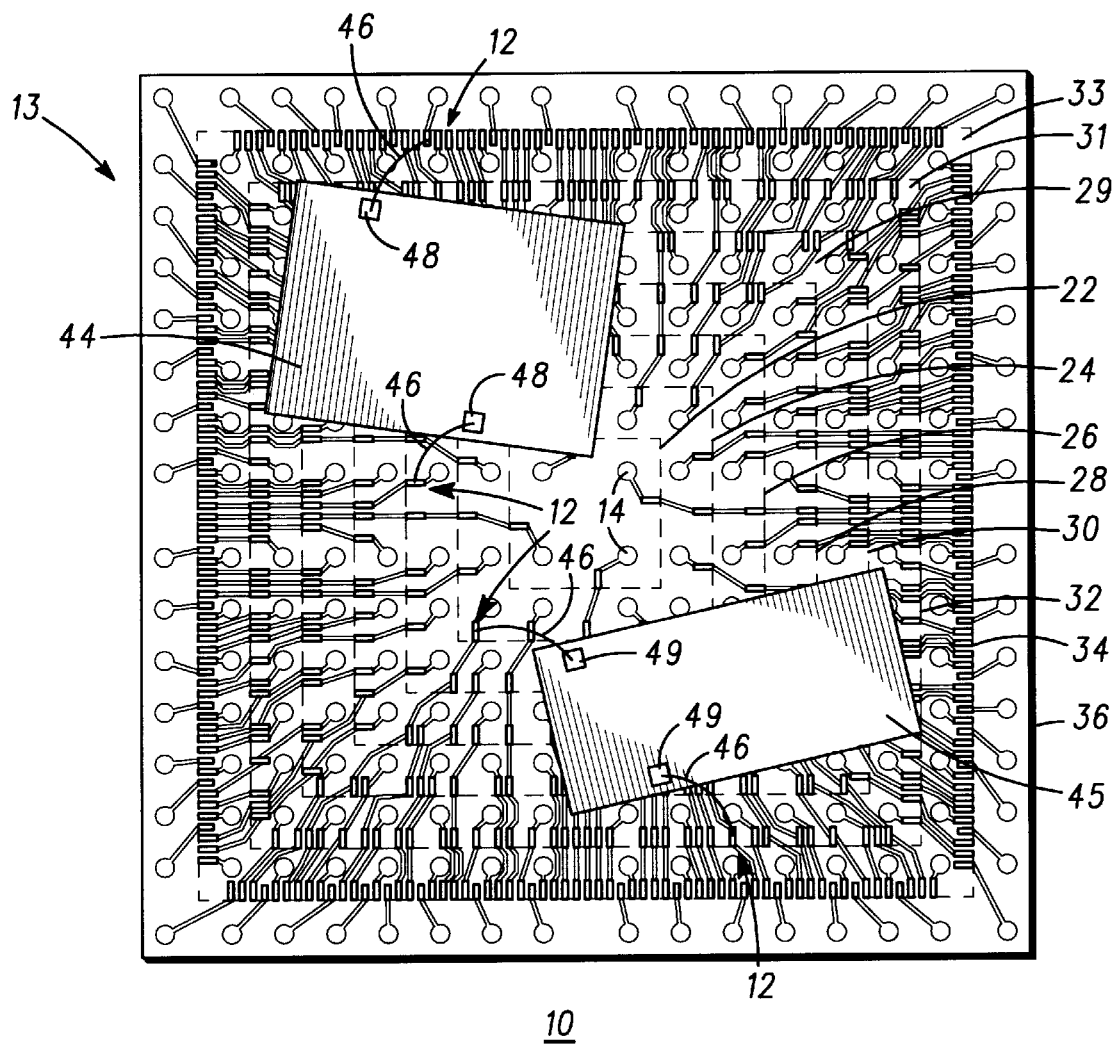
FIG. 6 illustrates multiple semiconductor components attached to the top surface of the substrate in accordance with the present invention.

FIG. 6 illustrates multiple semiconductor components 44 and 45 attached to top surface 13 of substrate 10. Substrate 10 includes interconnect regions 21, 23, 25, 27, 29, 31, 33, and 35, each having interconnect lines 11, wirebond fingers 12, and vias 14. Semiconductor components 44 and 45 are attached to substrate 10 preferably using an electrically nonconductive adhesive material. It should be noted that the number of semiconductor components 44 and 45 attached to substrate 10 is not a limitation of the present invention. Semiconductor components 44 and 45 have respective die pads 48 and 49. Electrical contact from die pads 48 and 49 is made by wirebonds 46 to selected wirebond fingers 12 on top surface 13 of substrate 10. Thus, signals are transferred by semiconductor components 44 and 45 through respective die pads 48 and 49 to vias 14. It should be further noted that wirebonds 46 can be attached to die pads 48 or 49 and extend to any of the plurality of wirebond fingers 12 along a selected interconnect line 11. FIG. 3 shows that the bottom major surface of substrate 10 has corresponding bond pads 17 electrically connected to vias 14. Although semiconductor components 44 and 45 are shown attached side by side to substrate 10, semiconductor component 44 could alternatively be placed on top of semiconductor component 45 to form stacked semiconductor components. It should be noted that semiconductor components 44 and 45 could be located at various angles with reference to an edge of substrate 10. Further, components such as resistors, inductors, capacitors, packaged semiconductor devices, and substrates can be attached to substrate 10.

By now it should be appreciated that a structure and a method have been provided for a package that reduces the semiconductor device manufacturer's costs. The substrate can accommodate either a large semiconductor component size and a small I/O pin count or a small semiconductor component size and a large I/O pin count. The interconnect pattern on the substrate allows the substrate to be sectioned or cut in a variety of geometries, which reduces package tooling costs and package development cycle time.

What is claimed is:

1. A method for manufacturing a semiconductor device comprising:

providing a substrate having a major surface;

forming nested ring-like patterns on the major surface, wherein a portion of the nested ring-like patterns is excisable;

defining each of the nested ring-like patterns by forming a plurality of wire bond fingers within an interconnect region; and forming an interconnect line that connects a first wire bond finger formed in a first interconnect region with a second wire bond finger formed in a second interconnect region, wherein the first interconnect region and the second interconnect region are portions of the nested ring-like patterns.

2. The method of claim 1, further comprising the step of forming a via in a first interconnect region and a via in a second interconnect region.

3. The method of claim 2, further comprising the step of electrically connecting the via in the first interconnect region to the first wirebond finger in the first interconnect region.

4. The method of claim 1, further comprising the step of attaching a first semiconductor component to the major surface of the substrate.

5. The method of claim 1, further comprising the step of attaching a second semiconductor component to the major surface of the substrate.

6. A method for patterning interconnect lines on a substrate, comprising the steps of:

providing a substrate having a first and a second major surface;

forming a first via and a first wirebond finger in a first portion of the substrate, wherein the first wirebond finger is formed on the first major surface of the substrate;

electrically coupling the first via to the first wirebond finger;

forming a second via, a second wirebond finger, and a third wirebond finger on a second portion of the substrate, wherein the second portion is adjacent the first portion;

electrically coupling the second wirebond finger to the first wirebond finger; and electrically coupling the third wirebond finger to the second via.

7. The method of claim 6, further comprising the steps of forming a first bond pad in the first portion of the substrate, wherein the first bond pad is on the second major surface of the substrate and electrically connected to the first via.

8. The method of claim 6, further comprising the steps of forming a second bond pad on the second major surface of the substrate, wherein the second bond pad is in the second portion of the substrate and electrically connected to the second via.

9. The method of claim 6, further comprising the step of sizing the first portion such that the first via and first wirebond finger fit within the first portion and sizing the second portion such that the second via and the second wirebond finger fit within the second portion.

* * * * *